United States Patent
Shimizu et al.

(10) Patent No.: US 10,297,470 B2
(45) Date of Patent: May 21, 2019

(54) RESIN SHEET FOR SEALING ELECTRONIC DEVICE AND METHOD FOR MANUFACTURING ELECTRONIC-DEVICE PACKAGE

(71) Applicant: NITTO DENKO CORPORATION, Ibaraki-shi, Osaka (JP)

(72) Inventors: Yusaku Shimizu, Ibaraki (JP); Eiji Toyoda, Ibaraki (JP); Goji Shiga, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 206 days.

(21) Appl. No.: 15/032,105

(22) PCT Filed: Oct. 3, 2014

(86) PCT No.: PCT/JP2014/076576
§ 371 (c)(1),
(2) Date: Apr. 26, 2016

(87) PCT Pub. No.: WO2015/064304
PCT Pub. Date: May 7, 2015

(65) Prior Publication Data
US 2016/0269000 A1     Sep. 15, 2016

(30) Foreign Application Priority Data
Oct. 28, 2013  (JP) ................... 2013-223208

(51) Int. Cl.
*H01L 21/56* (2006.01)
*H03H 9/64* (2006.01)
(Continued)

(52) U.S. Cl.
CPC ............ *H01L 21/56* (2013.01); *H01L 21/561* (2013.01); *H01L 21/78* (2013.01); *H01L 23/29* (2013.01);
(Continued)

(58) Field of Classification Search
CPC ....... H01L 21/56; H01L 21/561; H01L 21/78; H01L 23/29; H01L 24/97;
(Continued)

(56) References Cited

U.S. PATENT DOCUMENTS

2004/0213973 A1  10/2004  Hara
2008/0313895 A1  12/2008  Higuchi
(Continued)

FOREIGN PATENT DOCUMENTS

JP   2004/327623   11/2004
JP   2005/060584    3/2005
(Continued)

OTHER PUBLICATIONS

Duncan et al. "An Intercomparison of Tack Measurement", NPL Report No. CMMT(A)176, May 1999.*
(Continued)

*Primary Examiner* — Robert J Pascal
*Assistant Examiner* — Jorge L Salazar, Jr.
(74) *Attorney, Agent, or Firm* — Knobbe Martens Olson & Bear, LLP

(57) ABSTRACT

Provided are a resin sheet, for sealing an electronic device, which is not easily shifted out of position; and a method for manufacturing an electronic-device package. This resin sheet, for sealing an electronic device, has a probe tack of 5 to 500 g at 25° C. The tack is measured, using a probe having a diameter of 25 mm.

12 Claims, 2 Drawing Sheets

(51) Int. Cl.
   *H03H 9/10* (2006.01)
   *H01L 23/00* (2006.01)
   *H01L 21/78* (2006.01)
   *H01L 23/29* (2006.01)
   *H03H 3/08* (2006.01)
   *H01L 23/31* (2006.01)

(52) U.S. Cl.
   CPC .............. *H01L 24/97* (2013.01); *H03H 3/08* (2013.01); *H03H 9/1085* (2013.01); *H03H 9/64* (2013.01); *H01L 23/3121* (2013.01); *H01L 2224/16225* (2013.01); *H01L 2924/181* (2013.01)

(58) Field of Classification Search
   CPC ....... H01L 2224/16225; H01L 23/3121; H01L 2924/181; H03H 3/08; H03H 9/1085; H03H 9/64
   USPC ......................................... 333/133, 193–196
   See application file for complete search history.

(56) References Cited

U.S. PATENT DOCUMENTS

| | | |
|---|---|---|
| 2011/0024780 A1 | 2/2011 | Park |
| 2012/0283375 A1 | 11/2012 | Kageyama |
| 2013/0183469 A1 | 7/2013 | Shimizu et al. |
| 2015/0032042 A1 | 1/2015 | Funakoshi et al. |

FOREIGN PATENT DOCUMENTS

| | | |
|---|---|---|
| JP | 2006-019714 | 1/2006 |
| JP | 2007/329162 | 12/2007 |
| JP | 2008/053529 | 3/2008 |
| JP | 2008/098419 | 4/2008 |
| JP | 2008/258429 | 10/2008 |
| JP | 2008-260845 | 10/2008 |
| JP | 2009/091389 | 4/2009 |
| JP | 2009/123532 | 6/2009 |
| JP | 2009-246302 | 10/2009 |
| JP | 2010/153434 | 7/2010 |
| JP | 2013-006893 | 1/2013 |
| JP | 2013/109838 | 6/2013 |
| JP | 5223657 | 6/2013 |
| JP | 2013/145754 | 7/2013 |
| TW | 201335215 | 9/2013 |
| TW | 201336513 | 9/2013 |
| WO | WO2005/071731 | 8/2005 |
| WO | WO2011/062167 | 5/2011 |

OTHER PUBLICATIONS

Japanese Office Action dated Jan. 20, 2015 in corresponding Japanese Patent Application No. 2013-223208.
Japanese Office Action dated Mar. 17, 2015 in corresponding Japanese Patent Application No. 2013-223208.
Japanese Office Action dated Jun. 4, 2015 in corresponding Japanese Patent Application No. 2013-223208.
International Preliminary Report on Patentability, dated May 12, 2016, in International Application No. PCT/JP2014/076576.
Notification of Reasons for Refusal, dated Jul. 26, 2016, for the Japanese Patent Application No. 2015-170805.
Singaporean Office Action dated Nov. 28, 2016, in corresponding Singaporean Patent Application No. 11201603172S.
Japanese Office Action, dated Mar. 10, 2017, in corresponding Japanese Patent Application No. 2013-223208 filed Oct. 28, 2013.
Singaporean Office Action, dated Nov. 7, 2017, in corresponding Singaporean Patent Application No. 11201603172S.
A Japanese Decision of Appeal, issued Jan. 10, 2018, in corresponding Japanese Patent Application No. 2013-223208.
A Taiwanese Office Action, dated Feb. 5, 2018, in corresponding Taiwanese Patent Application No. 103135530.
Chinese Office Action, dated Mar. 15, 2018, in Chinese Patent Application No. 201480059065.1.
Chinese Office Action, dated Oct. 15, 2018, in corresponding Chinese Patent Application No. 201480059065.1.
Chinese Office Action, dated Feb. 11, 2019, in corresponding Chinese Patent Application No. 201480059065.1.

\* cited by examiner

RESIN SHEET FOR SEALING ELECTRONIC DEVICE AND METHOD FOR MANUFACTURING ELECTRONIC-DEVICE PACKAGE

TECHNICAL FIELD

The present invention relates to a resin sheet for sealing an electronic device and a method for manufacturing an electronic-device package.

BACKGROUND ART

As a method for sealing an electronic device, known is a method of sealing the electronic device with a resin sheet.

For example, Patent Documents 1 and 2 each disclose a method of: arranging a resin sheet on an electronically functional element (such as a SAW filter) mounted on a substrate; next putting, into a bag having gas barrier performance, the electronically functional element on the substrate, and the resin sheet; next reducing the pressure in the bag; and next sealing the electronically functional element in the bag with the resin sheet. This method has advantages that the SAW filter can be sealed under the reduced pressure to decrease the generation of voids, and that the method can be performed through a simple pressure decreasing apparatus.

PRIOR ART DOCUMENTS

Patent Documents

Patent Document 1: International Publication WO 2005/071731 (International Publication No. 05/071731 Pamphlet)
Patent Document 2: Japanese Patent No. 5223657

SUMMARY OF THE INVENTION

Problems to be Solved by the Invention

However, according to the method described in each of Patent Documents 1 and 2, the resin sheet easily contacts the internal surface of the bag so that the resin sheet is easily shifted out of position. The resin sheet that is a sheet filled with an inorganic filler at a high level is particularly shifted out of position.

An object of the present invention is to solve this problem to provide a resin sheet for sealing an electronic device that is not easily shifted out of position, and a method for manufacturing an electronic-device package.

Means for Solving the Problems

The present invention relates to a resin sheet, for sealing an electronic device, having a probe tack of 5 g to 500 g at 25° C., the tack being measured, using a probe having a diameter of 25 mm. Since the resin sheet satisfies this tack property, the sheet is not easily shifted out of position.

The resin sheet preferably has a surface roughness (Ra) of 400 nm or less. This case makes it possible to attain the tack property easily.

It is preferred that the resin sheet comprise an inorganic filler, and the content of the inorganic filler in the resin sheet is from 60 to 90% by volume. This case makes it possible to make the resin sheet small in thermal expansion coefficient and water absorption percentage. The case also makes it possible to prevent or decrease the deformation of the resin sheet that is based on, for example, contact between the resin sheet and the internal surface of a vacuum package container.

It is preferred that the resin sheet comprise an epoxy resin, and the epoxy resin has a softening point of 100° C. or lower. This case makes it possible to attain the above-mentioned tack property easily without decreasing the amount of the inorganic filler. In other words, the resin sheet can be heightened in resistance against the shift out of position without being decreased in thermal expansion coefficient nor water absorption percentage.

It is preferred that the resin sheet comprise a phenolic resin, and the phenolic resin have a softening point of 100° C. or lower. This case makes it possible to attain the above-mentioned tack property easily without decreasing the amount of the inorganic filler. In other words, the resin sheet can be heightened in resistance against the shift out of position without being decreased in thermal expansion coefficient nor water absorption percentage.

The resin sheet preferably has a tensile storage elastic modulus of $10^{-2}$ MPa to $10^3$ MPa at 25° C.

The resin sheet is preferably used to seal the electronic device that is an electronic device arranged in a vacuum package container. The resin sheet is not easily shifted out of position even when the resin sheet contacts the internal surface of the vacuum package container. Thus, the resin sheet is suitable for this method.

The resin sheet is preferably used to a method, for manufacturing an electronic-device package, comprising the step of arranging the resin sheet over the electronic device mounted over a substrate, the step of putting, into a vacuum package container, the electronic device mounted over the substrate and the resin sheet arranged over the electronic device, and the step of sealing the electronic device in the vacuum package container with the resin sheet. The resin sheet is not easily shifted out of position even when the resin sheet contacts the internal surface of the vacuum package container. Thus, the resin sheet is suitable for this method. This method is described in International Publication WO 2005/071731 and Japanese Patent No. 5223657.

The electronic device is preferably a SAW filter.

The present invention also relates to a method, for manufacturing an electronic-device package, comprising the step of sealing an electronic device with a resin sheet having a probe tack of 5 g to 500 g at 25° C., the tack being measured, using a probe having a diameter of 25 mm.

It is preferred that this electronic-device package manufacturing method further comprise the step of arranging the resin sheet over the electronic device mounted over a substrate, and the step of putting, into a vacuum package container, the electronic device mounted over the substrate and the resin sheet arranged over the electronic device, and in the step of sealing the electronic device, the electronic device in the vacuum package container is sealed with the resin sheet.

MODE FOR CARRYING OUT THE INVENTION

Figure 1:
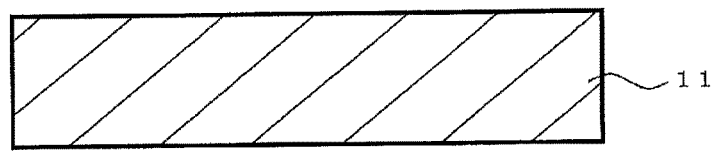
FIG. 1 is a schematic sectional view of a resin sheet of Embodiment 1.

The present invention will be described in detail by way of embodiments demonstrated below. However, the invention is not limited to only these embodiments.
[Embodiment 1]
FIG. 1 is a schematic sectional view of a resin sheet 11 of Embodiment 1. A support, such as a polyethylene terephthalate (PET) film, may be arranged on each surface of the resin sheet 11. The support may be subjected to release treatment to peel off the support easily from the resin sheet 11.

The resin sheet 11 preferably has thermosetting property.

The resin sheet 11 preferably has a probe tack of 5 g or more, preferably 20 g or more at 25° C., the tack being measured, using a probe having a diameter of 25 mm. Since the tack is 5 g or more, the resin sheet 11 is brought into close contact with an electronic device at the time of mounting this sheet onto a sealing position of the electronic device. Consequently, at a subsequent time of handling the resin-sheet-mounted electronic device, this sheet is not shifted out of position so that shaping about which a small defective proportion is produced can be attained. The probe tack at 25° C. is 500 g or less. Since the probe tack is 500 g or less, the following can be attained: in a case where the resin sheet 11 is shifted out of position when mounted onto the electronic device, this sheet is peeled off to locate the sheet again in position and is again mounted thereon.

The probe tack measured using the 25-mm-diameter probe is measurable by a method described in the item "EXAMPLES".

The surface roughness (Ra) of the resin sheet 11 is preferably 400 nm or less, more preferably 200 nm or less. When the surface roughness is 400 nm or less, the above-mentioned tack property can easily be attained. The lower limit of the surface roughness (Ra) is not particularly limited. Thus, the surface roughness is, for example, 20 nm or more.

The surface roughness is measurable by a method described in the item "EXAMPLES".

The tensile storage elastic modulus of the resin sheet 11 is preferably $10^3$ MPa or less at 25° C. When the elastic modulus is $10^3$ MPa or less, the resin sheet can gain a good tack property. The tensile storage elastic modulus is preferably $10^{-2}$ MPa or more at 25° C. When the elastic modulus is $10^{-2}$ MPa or more at 25° C., the deformation of the resin sheet 11 can be prevented or decreased, the deformation being based on, for example, contact between the resin sheet 11 and the internal surface of a vacuum package container.

The tensile storage elastic modulus at 25° C. is measurable by a method described in the item "EXAMPLES".

The resin sheet preferably contains an epoxy resin.

The epoxy resin is not particularly limited. Examples thereof include triphenylmethane type epoxy resin, cresol novolak type epoxy resin, biphenyl type epoxy resin, modified bisphenol A type epoxy resin, bisphenol A type epoxy resin, bisphenol F type epoxy resin, modified bisphenol F type epoxy resin, dicyclopentadiene type epoxy resin, phenol novolak type epoxy resin, phenoxyepoxy resin, and various other epoxy resins. These epoxy resins may be used singly or in any combination of two or more thereof.

The softening point of the epoxy resin is preferably 100° C. or lower. When the softening point is 100° C. or lower, the resin sheet is heightened in tack property. The softening point of the epoxy resin is more preferably 80° C. or lower. In the meantime, the softening point of the epoxy resin is preferably 30° C. or higher. When the softening point is 30° C. or higher, the resin is satisfactorily handled at the time of mixing the raw material with other materials.

The softening point is measurable by DSC (differential scanning calorimetry). Specifically, a differential scanning calorimeter (Q2000, manufactured by a company, TA Instruments) is used to obtain a DSC curve of the resin under conditions that the measuring temperature is from −10 to 300° C. and the temperature-raising rate is 5° C./minute; and from the resultant DSC curve, the softening point can be gained.

In order to ensure the reactivity of the epoxy resin, the epoxy equivalent of the epoxy resin is preferably from 150 to 250.

The resin sheet 11 preferably contains a phenolic resin.

The phenolic resin is not particularly limited as far as the resin causes a curing reaction with the epoxy resin. Examples thereof include phenol novolak resin, phenol aralkyl resin, biphenylaralkyl resin, dicyclopentadiene type phenolic resin, cresol novolak resin, and resol resin. These phenolic resins may be used singly or in any combination of two or more thereof.

From the viewpoint of the reactivity of the phenolic resin with the epoxy resin, the phenolic resin is preferably a resin having a hydroxyl equivalent of 70 to 250 and a softening point of 30 to 110° C. The phenolic resin is preferably phenol novolak resin from the viewpoint of a high curing reactivity thereof. The phenolic resin is also preferably a low hygroscopic resin, such as phenol aralkyl resin or phenylaralkyl resin, from the viewpoint of reliability.

The softening point of the phenolic resin is preferably 100° C. or lower. When the softening point is 100° C. or lower, the resin sheet is heightened in tack property. The softening point of the phenolic resin is more preferably 80° C. or lower. In the meantime, the softening point of the phenolic resin is preferably 30° C. or higher. When the softening point is 30° C. or higher, the resin is satisfactorily handled at the time of mixing the raw material with other materials.

The total content of the epoxy resin and the phenolic resin in the resin sheet 11 is preferably 5% or more by weight. When the content is 5% or more by weight, the resin sheet 11 can satisfactorily gain adhering strength onto an electronic device, a substrate and others. The total content of the epoxy resin and the phenolic resin in the resin sheet 11 is preferably 20% or less by weight. When the content is 20% or less by weight, the hygroscopicity of the resin sheet can be restrained into a low level.

About the blend ratio between the epoxy resin and the phenolic resin, these resins are blended with each other to set the total amount of hydroxyl groups in the phenolic resin into a range preferably from 0.7 to 1.5 equivalents, more preferably from 0.9 to 1.2 equivalents per equivalent of epoxy groups in the epoxy resin.

The resin sheet 11 preferably contains a curing accelerator.

The curing accelerator is not particularly limited as long as it promotes curing of the epoxy resin and the phenolic resin. Examples thereof include imidazole-based curing accelerators such as 2-methylimidazole (trade name; 2MZ), 2-undecylimidazole (trade name; C11-Z), 2-heptadecylimidazole (trade name; C17Z), 1,2-dimethylimidazole (trade name; 1.2DMZ), 2-ethyl-4-methylimidazole (trade name; 2E4MZ), 2-phenylimidazole (trade name; 2PZ), 2-phenyl-4-methylimidazole (trade name; 2P4MZ), 1-benzyl-2-methylimidazole (trade name; 1B2MZ), 1-benzyl-2-phenylimidazole (trade name; 1B2PZ), 1-cyanoethyl-2-methylimidazole (trade name; 2MZ-CN), 1-cyanoethyl-2-undecylimidazole (trade name; C11Z-CN), 1-cyanoethyl-2-phenylimidazolium trimellitate (trade name; 2PZCNS-PW), 2,4-diamino-6-[2'-methylimidazolyl-(1')]-ethyl-s-triazine (trade name; 2MZ-A), 2,4-diamino-6-[2'-undecylimidazolyl-(1')]-ethyl-s-triazine (trade name; C11Z-A), 2,4-diamino-6-[2'-ethyl-4'-methylimidazolyl-(1')]-ethyl-s-triazine (trade name; 2E4MZ-A), 2,4-diamino-6-[2'-metthylimidazolyl-(1')]-ethyl-s-triazine isocyanuric acid adduct (trade name; 2MA-OK), 2-phenyl-4,5-dihydroxymethylimidazole (trade name; 2PHZ-PW), and 2-phenyl-4-methyl-5-hydroxymethylimidazole (trade name; 2P4MZ-PW) (all of these compounds are manufactured by Shikoku Chemicals Corporation).

Imidazole type curing promoters are particularly preferred, and 2-phenyl-4,5-dihydroxymethylimidazole is more preferred since the curing reaction is restrained at the kneading temperature.

The content of the curing promoter is preferably from 0.1 to 5 parts by weight for 100 parts by weight of the total of the epoxy resin and the phenolic resin.

The resin sheet 11 preferably contains a thermoplastic resin (elastomer).

Examples of the thermoplastic resin include natural rubber, butyl rubber, isoprene rubber, chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, a fluoro resin, a styrene-isobutylene-styrene triblock copolymer, and a methylmethacrylate-butadiene-styrene copolymer (MBS resin). These thermoplastic resins may be used alone or in combination of two or more thereof.

The content of the thermoplastic resin in the resin sheet 11 is preferably 1% or more by weight. When the content is 1% or more by weight, softness and flexibility can be given to the resin sheet. The content of the thermoplastic resin in the resin sheet 11 is preferably 30% or less, more preferably 15% or less, even more preferably 10% or less by weight. When the content is 30% or less by weight, the resin sheet can gain a satisfactory adhering strength on an electronic device and others.

The resin sheet 11 preferably contains an inorganic filler. The incorporation of the inorganic filler thereinto makes it possible to make the resin sheet small in thermal expansion coefficient.

Examples of the inorganic filler include quartz glass, talc, silica (fused silica, crystalline silica, etc.), alumina, aluminum nitride, silicon nitride, and boron nitride. Among these inorganic fillers, silica and alumina are preferable, and silica is more preferable because the thermal expansion coefficient can be reduced well. Silica is preferably fused silica and more preferably spherical fused silica because of its excellent fluidity.

The average particle size of the inorganic filler is preferably 5 μm or more. If the average particle size is 5 μm or more, the flexibility and softness of the resin sheet 11 can be easily obtained. The average particle size of the inorganic filler is preferably 50 μm or less, and more preferably 30 μm or less. If the average particle size is 50 μm or less, a high filling rate of the inorganic filler can be easily obtained.

For example, the average particle size can be measured by using a laser diffraction-scattering type particle size distribution measuring apparatus on a sample that is arbitrarily extracted from a population.

The inorganic filler is preferably treated (pretreated) with a silane coupling agent. By this treatment, wettability of the inorganic filler to the resin can be improved, and dispersibility of the inorganic filler can be enhanced.

The silane coupling agent is a compound having a hydrolyzable group and an organic functional group in a molecule.

Examples of the hydrolyzable group include alkoxy groups having 1 to 6 carbon atoms such as a methoxy group and an ethoxy group, an acetoxy group, and a 2-mthoxyrthoxy group. Among these, a methoxy group is preferable because it is easy to remove a volatile component such as an alcohol generated by hydrolysis.

Examples of the organic functional group include a vinyl group, an epoxy group, a styryl group, a methacrylic group, an acrylic group, an amino group, a ureido group, a mercapto group, a sulfide group, an isocyanate group. Among these, an epoxy group is preferable because the epoxy group can easily react with an epoxy resin and a phenolic resin.

Examples of the silane coupling agent include vinyl group-containing silane coupling agents such as vinyltrimethoxysilane and vinyltriethoxysilane; epoxy group-containing silane coupling agents such as 2-(3,4-epoxycyclohexyl)ethyltrimethoxysilane and 3-glycidoxypropyl methyldimethoxysilane, 3-glycidoxypropyl trimethoxysilane, 3-glycidoxypropyl methyldiethoxysilane, and 3-glycidoxypropyl triethoxysilane; styryl group-containing silane coupling agents such as p-styryltrimethoxysilane; methacrylic group-containing silane coupling agents such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; acrylic group-containing silane coupling agents such as 3-acryloxypropyltrimethoxysilane; amino group-containing silane coupling agents such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysialne, 3-triethoxysilyl-N-(1,3-dimethyl-butylidene)propylamine, N-phenyl-3-aminopropyltrimethoxysialne, and N-(vinylbenzyl)-2-aminoethyl-3-aminopropyltrimethoxysilane; ureido group-containing silane coupling agents such as 3-ureidopropyltriethoxysilane; mercapto group-containing silane coupling agents such as 3-mercaptopropylmethyldimethoxysilane and 3-mercaptopropyltrimethoxysilane; sulfide group-containing silane coupling agents such as bis(triethoxysilylpropyl)tetrasulfide; and isocyanate group-containing silane coupling agents such as 3-isocyanatepropyltriethoxysilane.

A method of treating the inorganic filler with the silane coupling agent is not especially limited, and examples thereof include a wet method of mixing the inorganic filler and the silane coupling agent in a solvent and a dry method of treating the inorganic filler with the silane coupling agent in a gas phase.

The amount of the silane coupling agent to be used for the treatment is not especially limited; however, 0.1 to 1 part by weight of the silane coupling agent is preferably used for the treatment to 100 parts by weight of the non-treated inorganic filler.

The content of the inorganic filler in the resin sheet 11 is preferably 60% or more, more preferably 74% or more by volume. When the content is 60% or more by volume, the resin sheet can be decreased in thermal expansion coefficient and hygroscopicity. In the meantime, the content of the inorganic filler is preferably 90% or less, more preferably 85% or less by volume. When the content is 90% or less by weight, the resin sheet can gain good tack property, softness, fluidity and adhesion.

The content of the inorganic filler can be described by using "% by weight" as a unit. As a typical example, the content of silica is described by using "% by weight" as a unit.

The specific gravity of silica is normally 2.2 g/cm³. Therefore, a preferred range of the content (% by weight) of silica is as follows.

The content of silica in the resin sheet 11 is preferably 74% by weight or more, and more preferably 84% by weight or more. The content of silica in the resin sheet 11 is preferably 94% by weight or less, and more preferably 91% by weight or less.

The specific gravity of alumina is normally 3.9 g/cm³. Therefore, a preferred range of the content (% by weight) of alumina is as follows.

The content of alumina in the resin sheet 11 is preferably 83% by weight or more, and more preferably 90% by weight or more. The content of alumina in the resin sheet 11 is preferably 97% by weight or less, and more preferably 95% by weight or less.

Besides the components described above, the resin sheet 11 may contain, as needed, other compounding agents generally used in manufacture of a sealing resin, such as a flame retardant component, a pigment, and a silane coupling agent.

Examples of the flame retardant component include various types of metal hydroxides such as aluminum hydroxide, magnesium hydroxide, iron hydroxide, calcium hydroxide, tin hydroxide, and complex metal hydroxides; and a phosphazene compound. Among these flame retardant components, a phosphazene compound is preferable because of its excellent flame retardancy and strength after curing.

The pigment is not particularly limited, and an example thereof is carbon black.

The content of the silane coupling agent is not particularly limited, and is preferably from 0.1 to 1 part by weight for 100 parts by weight of the inorganic filler.

A method for manufacturing the resin sheet 11 is not particularly limited; however, it is preferable to employ a method of performing plastic working on a kneaded product obtained by kneading components described above (for example, the epoxy resin, the phenolic resin, the inorganic filler, and the curing accelerator) to form a sheet. By this working, the resin sheet 11 can be highly filled with the inorganic filler, and the thermal expansion coefficient can be designed to be low.

Specifically, the epoxy resin, the phenolic resin, the inorganic filler, the curing accelerator, etc. are melted and kneaded using a known kneader such as a mixing roll, a pressurizing kneader, and an extruder to prepare a kneaded product, and the obtained kneaded product is subjected to plastic working to form a sheet. As kneading conditions, the upper limit of the temperature is preferably 140° C. or lower, and more preferably 130° C. or lower. The lower limit of the temperature is preferably higher than or equal to the softening point of components described above, and is 30° C. or higher, and preferably 50° C. or higher, for example. The kneading time is preferably 1 minute to 30 minutes. The kneading is preferably performed under a reduced pressure condition (under a reduced pressure atmosphere), and the pressure under the reduced pressure condition is $1\times10^{-4}$ kg/cm² to 0.1 kg/cm², for example.

It is preferred to apply the plastic working to the kneaded product after the melt kneading in the state that the kneaded product keeps a high temperature without being cooled. The method for the plastic working is not particularly limited, and examples thereof include flat plate pressing, T-die extrusion, screw die extrusion, rolling, roll kneading, inflation extrusion, co-extrusion, and calendering methods. The plastic working temperature is preferably not lower than the respective softening points of the above-mentioned individual components, and is, for example, from 40 to 150° C., preferably from 50 to 140° C., more preferably from 70 to 120° C., considering the thermosetting property and the moldability of the epoxy resin.

The thickness of the resin sheet 11 is not particularly limited; however, the thickness is preferably 100 μm or more, and more preferably 150 μm or more. The thickness of the resin sheet 11 is preferably 2,000 μm or less, and more preferably 1,000 μm or less. If the thickness if within the above-described range, the electronic device can be sealed well.

FIG. 1 shows a case in which the resin sheet 11 is composed of a single layer; however, the resin sheet 11 is not limited to be composed of a single layer and may have a multilayer structure.

The resin sheet 11 is used to seal an electronic device. The resin sheet 11 is in particular preferably usable to seal an electronic device arranged in a vacuum package container. The resin sheet 11 is used to, for example, an electronic-device package manufacturing method including the step of arranging the resin sheet 11 over an electronic device mounted over a substrate, the step of putting, into a vacuum package container, the electronic device mounted over the substrate and the resin sheet 11 arranged over the electronic device, and the step of sealing the electronic device in the vacuum package container with the resin sheet 11. This method is described in International Publication WO 2005/071731 and Japanese Patent No. 5223657.

Examples of the electronic device include electronic devices each having a hollow structure (hollow type electronic devices), such as sensors, MEMS (micro electro mechanical systems), and SAW (surface acoustic wave) filters; semiconductor elements such as semiconductor chips, ICs (integrated circuits) and transistors; capacitors; and resistors. The present invention is preferably usable, particularly, for SAW filters. The hollow structure denotes a hollow region formed between the electronic device and a substrate when the electronic device is mounted over the substrate. The substrate is not particularly limited. Examples thereof include printed wiring boards, LTCC (low temperature co-fired ceramic) substrates, ceramic substrates, silicon substrates, and metallic substrates.

The vacuum package container is not particularly limited, and may be, for example, a bag having gas barrier performance. The vacuum package container is preferably a container having heat resistance, and is specifically a container having such heat resistance that the container can resist a temperature when the resin sheet 11 is thermally cured. The vacuum package container is also a container having softness and heat-sealing performance.

The vacuum package container is specifically a container having a multilayered structure in which a polyester type film is rendered an outer layer and further a polyethylene type film having heat sealing performance is rendered an inner layer (sealant layer). The inner layer is preferably, for example, a polypropylene film. The outer layer is preferably, for example, a polyimide film or a polyamide film. The container has an intermediate layer between the outer and inner layers. The intermediate layer is preferably a layer high in gas barrier performance, for example, an aluminum layer.

A typical example of the method for sealing the electronic device with the resin sheet 11 is a method of embedding the electronic device into the resin sheet 11, or a method of softening the resin sheet 11 and covering the electronic device with the softened resin sheet 11.

The resin sheet 11 can function as a sealing resin for protecting the electronic device and any element accompanying the device from the external environment.

[Method for Manufacturing Electronic-Device Package]

Examples of a method for manufacturing an electronic-device package include a first manufacturing method of sealing the electronic device after the device is vacuum-packaged, and a second manufacturing method of sealing the electronic device before the device is vacuum-packaged.

The following will describe the first and second manufacturing methods. The description is about a typical example that is an example of manufacturing a SAW filter package.

[First Manufacturing Method]

Figure 2:
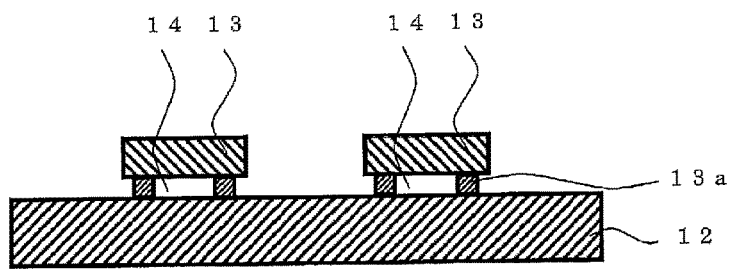
FIG. 2 is a schematic sectional view of a printed circuit board on which SAW filters are mounted.

SAW-filter-mounted-substrate Providing Step:

In a SAW-filter-mounted-substrate providing step, an LTCC substrate 12 is provided on which plural SAW filters 13 are mounted (see FIG. 2). The SAW filters 13 can be formed by using a known method to dice a piezoelectric crystal in which predetermined comb-shaped electrodes are formed to make the crystal into individual pieces. In order to mount the SAW filters 13 onto the LTCC substrate 12, a known device, such as a flip chip bonder or a die bonder, is usable. The SAW chips 13 are electrically connected to the LTCC substrate 12 through projected electrodes 13a such as bumps. Moreover, between each of the SAW filters 13 and the LTCC substrate 12, a hollow region 14 is kept not to hinder the transmission of surface acoustic waves on the front surface of the SAW filter. The distance between the SAW filter 13 and the LTCC substrate 12 can be appropriately set, and is generally from about 15 to 50 μm.

Figure 3:
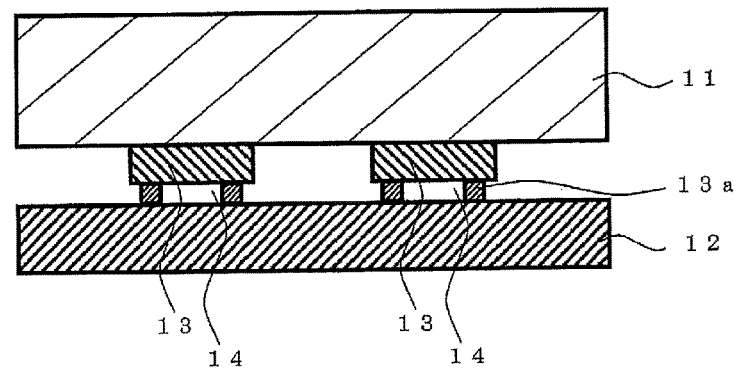
FIG. 3 is a view that schematically illustrates a situation that the resin sheet is laminated on the SAW filters mounted on the printed circuit board.
Figure 5:
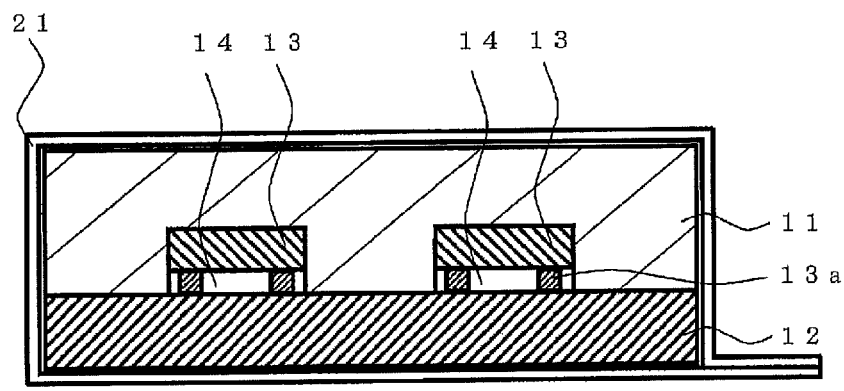
FIG. 5 is a view that schematically illustrates a situation that the vacuum package container is airtightly sealed.

Arranging Step:

A resin sheet 11 is arranged onto the SAW filters 13 mounted on the LTCC substrate 12 (see FIG. 3). A release sheet (for example, a support as described above) may be laid onto a surface of the resin sheet 11 that does not contact the SAW filters 13. This situation is illustrated in FIG. 5 in International Publication WO 2005/071731.

Figure 4:
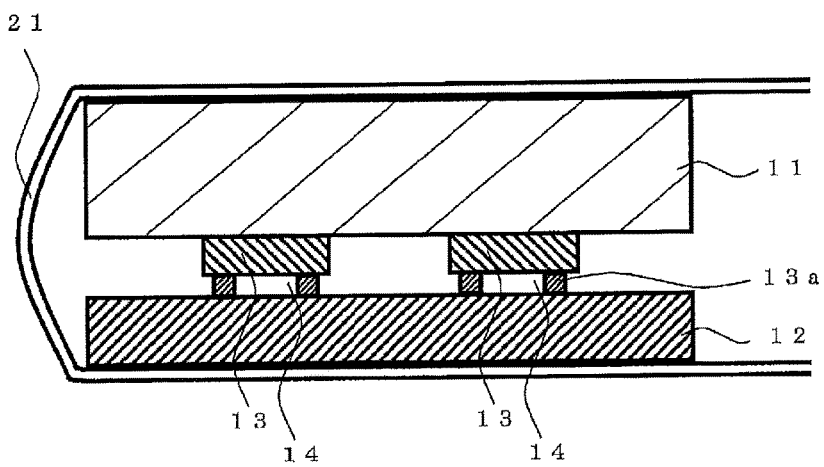
FIG. 4 is a view that schematically illustrates a situation of putting, into a vacuum package container, the SAW filters mounted on the printed circuit board and the resin sheet on the SAW filters.

Inserting Step:

Next, into a vacuum package container 21 are put the SAW filters 13 mounted on the LTCC substrate 12 and the resin sheet 11 on the SAW filters 13 (see FIG. 4).

Vacuum Packaging Step:

Next, the pressure of the inside of the vacuum package container 21 is reduced (into, for example, 500 Pa or less), and then the vacuum package container 21 is airtightly sealed (see FIG. 5).

Specifically, the vacuum package container 21, in which the LTCC substrate 12, the SAW filters 13 and the resin sheet 11 are located, is put into an airtightly closed vessel, and next the closed vessel is degassed to reduce the pressure of the inside of the closed vessel. Thereafter, a heat-melting heater (heat sealer) is used to melt-bond, from both sides of the container 21, regions of the vacuum package container 21 that are near an opening in this container 21 to each other. In this way, the vacuum package container 21 is airtightly sealed (see FIG. 5). This situation is illustrated in FIG. 3 in International Publication WO 2005/071731. The opening in the vacuum package container 21 may also be closed with, e.g., a clip.

When the vacuum package container 21 in the airtightly sealed state has been taken out from the air-tightly closed vessel, the vacuum package container 21 is turned into a state of adhering closely to the LTCC substrate 12 and the resin sheet 11 by a difference in pressure between the inside and outside of the vacuum package container 21.

The method for reducing the pressure of the inside of the vacuum package container 21 may also be, for example, a method of inserting a metallic pipe connected to a vacuum pump airtightly into the opening in the vacuum package container 21, and degassing the inside of the vacuum package container 21.

Heating Step:

In a heating step, the vacuum package container 21 including the resin sheet 11 is heated together with this sheet to soften the resin sheet 11. The heating temperature is usually a temperature lower than the curing temperature of the resin sheet 11, and is, for example, from 50° C. to 140° C.

In this way, the softened resin sheet 11 invades gaps between the SAW filters 13 mounted on the LTCC substrate 12. As a result, the SAW filters 13 are covered with the resin sheet 11.

In the heating step, the vacuum package container 21 is heatable under a pressure (for example, atmospheric pressure) higher than that of the inside of the vacuum package container 21. This heating makes it possible to cause the softened resin sheet 11 to invade the gaps between the SAW filters 13 mounted on the LTCC substrate 12 by use of a difference in pressure between the inside and outside of the vacuum package container 21.

As illustrated in FIGS. 8 and 9 in International Publication WO 2005/071731 and FIG. 8 in Japanese Patent No. 5223657, for example, a heating/pressurizing roller or a press machine may be used to heat and pressurize the vacuum package container 21 to cause the softened resin sheet 11 to invade the gaps between the SAW filters 13 mounted on the LTCC substrate 12.

Thermally Curing Step:

Next, the vacuum package container 21 including the resin sheet 11 is heated together with this sheet 11 to cure the resin sheet 11 thermally.

A specific example of a method therefor is a method of putting the airtightly sealed vacuum package container 21 into an airtightly closable vessel, and then heating the vacuum package container 21 in the state that the vacuum package container 21 is pressurized through a pressuring medium filled into the airtightly closable container, thereby curing the resin sheet 11 thermally. This method makes it easy to control the shape and the size of the hollow regions 14 since the method makes it possible to heat and pressurize the vacuum package container 21 through the pressuring medium. Examples of the pressuring medium include air, water, and oil. This situation is illustrated in FIG. 4 in International Publication WO 2005/071731.

The heating temperature is, for example, from 60° C. to 150° C.

Other specific examples of the method include a method of hot-pressing the vacuum package container 21 by a press machine to cure the resin sheet 11 thermally, and a method of heating the vacuum package container 21 under a pressure (for example, atmospheric pressure) higher than that of the inside of the vacuum package container 21 to heat the resin sheet 11 thermally, these methods being also preferred. This situation is illustrated in FIGS. 8 and 9 in Japanese Patent No. 5223657.

Figure 6:
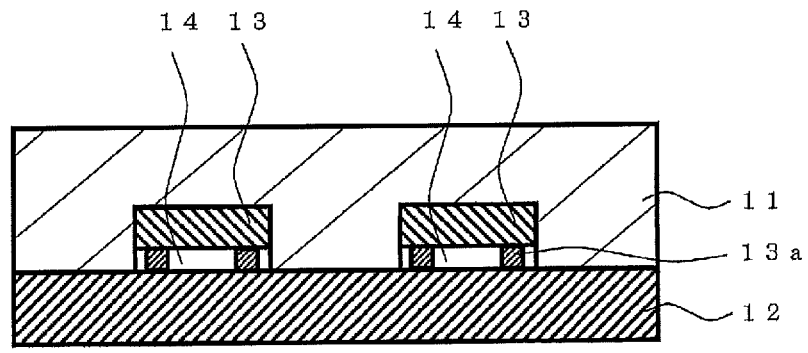
FIG. 6 is a view that schematically illustrates a situation that the SAW filters embedded in the resin sheet are taken out from the vacuum package container.
Figure 7:
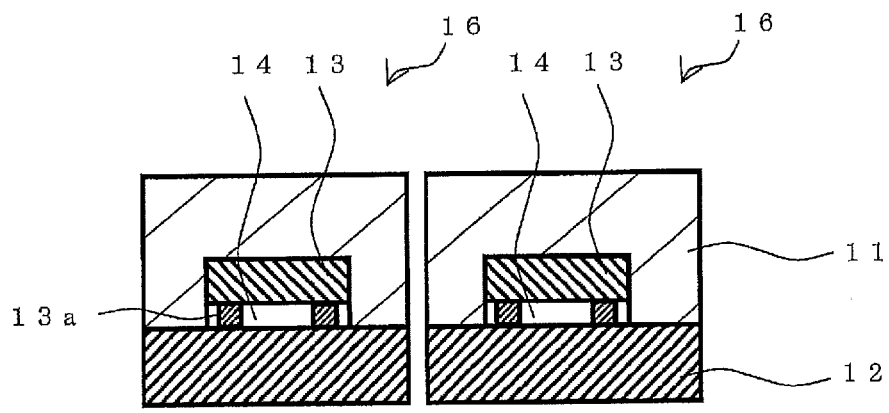
FIG. 7 is a schematic sectional viewed of SAW filter packages that have been divided.

Dividing Step:

Thereafter, the SAW filters 13 sealed with the resin sheet 11 is taken out from the vacuum package container 21, and then the LTCC substrate 12 is divided into pieces having the respective SAW filters 13 (see FIGS. 6 and 7). In this way, SAW filter packages 16 can be obtained. Examples of the method for the division include dicing, and cutting/breaking.

The method of the example described just above has, for example, advantages that the SAW filters can be sealed under the reduced pressure so that the generation of voids can be decreased, and that the method can be attained, using a simple pressure reducing apparatus.

In the case of using, in the example, semiconductor chips instead of the SAW filters 13, gaps between the semiconductor chips and the substrate may be filled with an underfill material. This situation is illustrated in FIG. 7 in International Publication WO 2005/071731.

In the example, a method has been demonstrated in which the heating step and the thermally curing step are performed at two stages. It is also preferred to combine these steps with each other to attain operations therein through a single step.

As described above, the first manufacturing method is, for example, a method including the step of arranging the resin sheet 11 over an electronic device mounted over a substrate, the step of putting, into a vacuum package container, the electronic device mounted over the substrate and the resin sheet arranged over the electronic device, the step of vacuum-packaging the substrate, the electronic device and the resin sheet 11 each put in the vacuum package container, and the step of sealing the electronic device inside the vacuum package container with the resin sheet 11. By this method, an electronic-device package can be manufactured.

After the vacuum-packaging, the vacuum degree of the inside of the vacuum package container is, for example, 500 Pa or less.

Usually, the first manufacturing method further includes the step of curing a region of a sealed body obtained by sealing the electronic device with the resin sheet 11, this region being a region originating from the resin sheet 11, the step of taking out a cured body obtained by curing the resin-sheet-11-originating region of the sealed body, and the step of dicing the cured body.

In the step of sealing the electronic device with the resin sheet 11 in the first manufacturing method, for example, by heating the vacuum package container, which includes the electronic device mounted over the substrate and the resin sheet 11 arranged over the electronic device, together with the device and the sheet, the resin sheet 11 is softened to seal the electronic device with the softened resin sheet 11. In this step, it is preferred to heat the vacuum package container, which includes the resin sheet 11 and the others, together therewith, under a pressure (for example, atmospheric pressure) higher than that of the inside of the vacuum package container.

In the step of curing the resin-sheet-11-originating region of the sealed body, this resin-sheet-11-originating region of the sealed body is cured, for example, by heating the vacuum package container, which includes the sealed body, together with the body. In this step, it is preferred to heat the vacuum package container, which includes the sealed body, together with the body under a pressure (for example, atmospheric pressure) higher than that of the inside of the vacuum package container.

[Second Manufacturing Method]

The first manufacturing method demonstrated is a method of sealing the vacuum package container 21 airtightly, and subsequently heating the resultant. However, according to the second manufacturing method, inside a pressure-reduced closed vessel, the vacuum package container 21 in which the LTCC substrate 12, the SAW filters 13 and the resin sheet 11 are put is heated at a temperature lower than the curing temperature of the resin sheet 11; and subsequently the vacuum package container 21 is airtightly sealed. According to this method, when a solvent is present in the resin sheet 11, the solvent can be volatized. This situation is illustrated in FIG. 3 in Japanese Patent No. 5223657.

As described above, the second manufacturing method is a method including, for example, the step of arranging the resin sheet 11 over an electronic device mounted over a substrate, the step of putting, into a vacuum package container, the electronic device mounted over the substrate and the resin sheet 11 arranged over the electronic device, the step of sealing the electronic device inside the vacuum package container with the resin sheet 11, and the step of vacuum-packaging a sealed body obtained by sealing the electronic device with the resin sheet 11. By this method, an electronic-device package can be favorably manufactured.

In the step of sealing the electronic device with the resin sheet 11 in the second manufacturing method, for example, by heating the vacuum package container 11, which includes the electronic device mounted over the substrate and the resin sheet 11 arranged over the electronic device, together with the device and the sheet in a reduced-pressure atmosphere, the resin sheet 11 is softened and then the electronic device is covered with the softened resin sheet 11. By the covering, the electronic device inside the vacuum package container is sealed with the resin sheet 11.

Usually, the second manufacturing method further includes the step of curing a region of the vacuum-packaged sealed body, this region being a region originating from the resin sheet 11, the step of taking out a cured body obtained by curing the resin-sheet-11-originating region of the sealed body, and the step of dicing the cured body.

As described above, the first and second manufacturing methods are summarized, for example, as follows: the methods are each a method including the step of arranging the resin sheet 11 over an electronic device mounted over a substrate, the step of putting, into a vacuum package container, the electronic device mounted over the substrate and the resin sheet 11 arranged over the electronic device, and the step of sealing the electronic device in the vacuum package container with the resin sheet 11; and this method makes it possible to manufacture an electronic-device package favorably.

In this method, the resin sheet 11 easily contacts the internal surface of the bag, so that the resin sheet is easily shifted out of position. However, the resin sheet 11 satisfies the above-specified tack; thus, this method is in particular preferably usable.

EXAMPLES

Hereinafter, preferred examples of this invention will be demonstratively described in detail. However, about materials, blend amounts and others that are described in the examples, the scope of this invention is not limited only thereto unless the specification includes any restrictive description thereabout.

Components used in the examples are as follows:

Epoxy resin: YSLV-80XY, manufactured by Nippon Steel Chemical Corp. (bisphenol F type epoxy resin; epoxy equivalent: 200 g/eq., and softening point: 80° C.)

Phenolic resin A: MEH-7851-SS, manufactured by Meiwa Plastic Industries, Ltd. (phenolic resin having a biphenylaralkyl skeleton; hydroxyl equivalent: 203 g/eq., and softening point: 67° C.)

Phenolic resin B: ND564, manufactured by Showa Highpolymer Co., Ltd. (phenol novolak resin; hydroxyl equivalent: 107 g/eq., and softening point: 60° C.)

Thermoplastic resin: METABLEN J-5800, manufactured by Mitsubishi Rayon Co., Ltd. (MBS resin; primary particle diameter: 0.5 μm)

Inorganic filler: FB-9454FC, manufactured by Denka Co., Ltd. (spherical silica; average particle diameter: 20 μm)

Silane coupling agent: KBM-403, manufactured by Shin-Etsu Chemical Co., Ltd. (3-glycidoxypropyltrimethoxysilane)

Carbon black: #20, manufactured by Mitsubishi Chemical Corp.

Curing promoter: 2PHZ-PW (2-phenyl-4,5-dihydroxymethylimidazole), manufactured by Shikoku Chemicals Corp.

Cover films used in the examples are as follows:

Cover film 1: MRF, manufactured by Mitsubishi Chemical Corp. (thickness: 50 μm, and surface roughness: 50 nm)

Cover film 2: U4, manufactured by Teijin DuPont Films Japan Limited (thickness: 50 μm, and surface roughness: 400 nm)

Cover film 3: LUMILAR, manufactured by Mitsui Chemicals, Inc. (film subjected to sand matting treatment; thickness: 50 μm, and surface roughness: 200 nm)

[Examples and Comparative Examples]

In each of the examples, in accordance with blend proportions described in Table 1, individual components were blended with each other, and the blend was melted and kneaded through a roll kneader at 60 to 120° C. under a reduced pressure (of 0.01 kg/cm$^2$) for 10 minutes to prepare a kneaded product. Next, the resultant kneaded product was arranged between two cover films, and then shaped into a sheet form by a flat-plate press method to produce each resin sheet having a thickness of 200 μm.

[Evaluations]

The resultant resin sheets were used to make evaluations described below. The results are shown in Table 1.

Probe Tack at 25° C.:

Two plates having a diameter of 25 mm were fitted to a viscoelasticity measuring instrument (RSA-3, manufactured by a company, TA Instruments). Any one of the resin sheets was fixed to a lower plate of the two plates through a double-sided tape, and then an upper plate (prove) of the two was lowered in an atmosphere of 25° C. to be pushed onto the resin sheet under a load of 100 g. Thereafter, the upper plate was raised up to measure a load necessary for peeling off the upper plate from the resin sheet.

Surface Roughness (Ra):

The surface roughness (Ra) of any one of the resin sheets was measured on the basis of JIS B 0601, using a noncontact three-dimensional roughness measuring instrument (NT3300) manufactured by VECO Corp. About conditions for measurements, 50 magnifications were used. A value according to the measurement was gained by multiplying the resultant measurement data by a median filter. While a site of the sheet to be measured was changed, the measurement was made five times. The average value thereof was defined as the surface roughness (Ra).

Tensile Storage Elastic Modulus at 25° C.:

From any one of the resin sheets, a rectangular sample (30 mm in length×10 mm in width×20 μm in thickness) was cut out. The tensile storage elastic modulus of this sample was measured in a tensile measurement mode at a distance of 20 mm between chucks and a temperature-raising rate of 10° C./minute in a range from 0 to 50° C., using a dynamic viscoelasticity measuring instrument (RSAIII, manufactured by Rheometric Scientific Inc.). From the measurement result, the tensile storage elastic modulus at 25° C. was gained.

Shift Out of Position:

Each (size: 65 mm square, and thickness: 200 μm) of some of the resin sheets was put onto an alumina substrate (size: 70 mm square, and thickness: 0.25 mm), and then the alumina substrate and the resin sheet were put into a vacuum package container (three-way aluminum bag HA-1013H for retorts; white type; size: 100 mm×130 mm). The substrate and the sheet were then vacuum-packaged at 90° C. and 1 torr. The vacuum package container including the aluminum substrate and the resin sheet was heated, together with the substrate and the sheet, at 150° C. for 1 hour to cure the resin sheet. The vacuum package container was naturally cooled to room temperature, and then a laminated product composed of the alumina substrate and the cured product of the resin sheet was taken out from the vacuum package container. It was then checked whether or not the cured product of the resin sheet was shifted from the original position thereof. The number of the laminated products about each of which the shift out of position was checked was 30. A count was made about the number of laminated products about which the shift out of position was caused, out of the 30 products.

When the proportion represented by the following was 10% or less, the working or comparative example was judged to be good (circular mark), or when the proportion was more than 10%, the example was judged to be bad (cross mark):

("the number of the laminated products about which the shift out of position was caused"/"the number of the laminated products, i.e., 30")×100".

Handleability:

In the case of mounting any one of the resin sheets, from the resin sheet the cover films being removed, onto a mounting substrate, the resin sheet was judged to be bad (cross mark) when the resin sheet adhered closely to the finger(s) or the chucks so that the resin sheet did not keep the original sheet form thereof. In the meantime, when the resin sheet kept the original form, the resin sheet was judged to be good (circular mark)

TABLE 1

| | | Example 1 | Example 2 | Example 3 | Example 4 | Example 5 | Comparative Example 1 | Comparative Example 2 | Comparative Example 3 |
|---|---|---|---|---|---|---|---|---|---|
| Blend proportions (part(s) by weight) | Epoxy resin | 4.3 | 4.7 | 4.5 | 10.1 | 10.1 | 4.0 | 4.5 | 14.6 |
| | Phenolic resin A | 1.6 | 1.7 | 0.7 | 3.7 | 3.7 | 1.5 | 0.7 | 5.3 |
| | Phenolic resin B | 1.6 | 1.7 | 2.2 | 3.7 | 3.7 | 1.5 | 2.2 | 5.3 |
| | Thermoplastic resin | 3.3 | 3.6 | 3.3 | 7.8 | 7.8 | 2.7 | 3.3 | 9.7 |
| | Inorganic filler | 89.0 | 88.0 | 89.0 | 74.0 | 74.0 | 90.0 | 89.0 | 64.0 |
| | Carbon black | 0.2 | 0.2 | 0.2 | 0.6 | 0.6 | 0.2 | 0.2 | 0.8 |
| | Curing promoter | 0.1 | 0.1 | 0.1 | 0.2 | 0.2 | 0.1 | 0.1 | 0.2 |
| | Total | 100.0 | 100.0 | 100.0 | 100.0 | 100.0 | 100.0 | 100.0 | 100.0 |
| Filler content (% by volume) in resin sheet | | 81 | 80 | 81 | 60 | 60 | 83 | 81 | 49 |
| Used cover film | | Film 1 | Film 1 | Film 1 | Film 3 | Film 2 | Film 1 | Film 1 | Film 2 |

TABLE 1-continued

|  |  | Example 1 | Example 2 | Example 3 | Example 4 | Example 5 | Comparative Example 1 | Comparative Example 2 | Comparative Example 3 |
|---|---|---|---|---|---|---|---|---|---|
| Evaluations | Probe tag (g) at 25° C. | 25 | 80 | 450 | 500 | 400 | 2 | 3 | 1500 |
|  | Surface roughness (nm) | 90 | 90 | 90 | 200 | 400 | 70 | 70 | 400 |
|  | Tensile storage elastic modulus (MPa) at 25° C. | 800 | 600 | 800 | 2 | 2 | 1500 | 80 | 0.003 |
|  | Shift out of position | ○ | ○ | ○ | ○ | ○ | x | x | ○ |
|  | Handleability | ○ | ○ | ○ | ○ | ○ | ○ | ○ | x |

DESCRIPTION OF REFERENCE SIGNS

11: Resin sheet
12: LTCC substrate
13: SAW filter
13a: Projected electrode
14: Hollow region
18: Electronic-device package
21: Vacuum package container

The invention claimed is:

1. An electronic device sealing resin sheet, having a probe tack of 5 g to 500 g at 25° C., the tack being measured using a probe having a diameter of 25 mm under a load of 100 g; wherein the electronic device sealing resin sheet has a surface roughness (Ra) of 400 nm or less.

2. The electronic device sealing resin sheet according to claim 1, comprising an epoxy resin, and the epoxy resin having a softening point of 100° C. or lower.

3. The electronic device sealing resin sheet according to claim 1, which is used to seal the electronic device that is an electronic device arranged in a vacuum package container.

4. The electronic device sealing resin sheet according to claim 3, wherein the electronic device is an SAW filter.

5. The electronic device sealing resin sheet according to claim 1, which is used to a method for manufacturing an electronic-device package that comprises the step of arranging the resin sheet over the electronic device mounted over a substrate,
the step of putting, into a vacuum package container, the electronic device mounted over the substrate and the resin sheet arranged over the electronic device, and
the step of sealing the electronic device in the vacuum package container with the resin sheet.

6. The electronic device sealing resin sheet according to claim 1 comprising an inorganic filler;
wherein a content of the inorganic filler in the resin sheet is 60% to 90% by volume.

7. The electronic device sealing resin sheet according to claim 1, having a tensile storage elastic modulus of $10^{-2}$ MPa to $10^3$ MPa at 25° C.

8. An electronic device sealing resin sheet, having a probe tack of 5 g to 500 g at 25° C., the tack being measured using a probe having a diameter of 25 mm under a load of 100 g;
wherein the electronic device sealing resin sheet comprises an inorganic filler, and
wherein a content of the inorganic filler in the resin sheet is from 60 to 90% by volume.

9. The electronic device sealing resin sheet according to claim 8, comprising an epoxy resin;
wherein the epoxy resin has a softening point of 100° C. or lower.

10. The electronic device sealing resin sheet according to claim 8, having a tensile storage elastic modulus of $10^{-2}$ MPa to $10^3$ MPa at 25° C.

11. An electronic device sealing resin sheet, having a probe tack of 5 g to 500 g at 25° C., the tack being measured using a probe having a diameter of 25 mm under a load of 100 g;
wherein the electronic device sealing resin sheet has a tensile storage elastic modulus of $10^{-2}$ MPa to $10^3$ MPa at 25° C.

12. The electronic device sealing resin sheet according to claim 11, comprising an epoxy resin;
wherein the epoxy resin has a softening point of 100° C. or lower.

* * * * *

UNITED STATES PATENT AND TRADEMARK OFFICE
CERTIFICATE OF CORRECTION

PATENT NO. : 10,297,470 B2  
APPLICATION NO. : 15/032105  
DATED : May 21, 2019  
INVENTOR(S) : Yusaku Shimizu Page 1 of 1

It is certified that error appears in the above-identified patent and that said Letters Patent is hereby corrected as shown below:

In the Specification

In Column 5, Lines 19-20, change "metthylimidazolyl" to --methylimidazolyl--.

In Column 6, Lines 21-22, change "2-mthoxyrthoxy" to --2-methoxyethoxy--.

In Column 6, Line 50 (Approx.), change "3-aminopropyltriethoxysialne," to --3-aminopropyltriethoxysilane,--.

In Column 6, Lines 51-52 (Approx.), change "aminopropyltrimethoxysialne," to --aminopropyltrimethoxysilane,--.

In Column 13, Line 23, change "nm)" to --nm).--.

In Column 14, Line 51 (Approx.), change "mark)" to --mark).--.

Signed and Sealed this  
Fifteenth Day of October, 2019

Andrei Iancu  
*Director of the United States Patent and Trademark Office*